(12) United States Patent
Vilangudipitchai et al.

(10) Patent No.: US 12,431,877 B2
(45) Date of Patent: Sep. 30, 2025

(54) HYBRID FLOP TRAY INCLUDING DIFFERENT FIN SIZE FLIP-FLOPS

(71) Applicant: QUALCOMM Incorporated, San Diego, CA (US)

(72) Inventors: Ramaprasath Vilangudipitchai, San Diego, CA (US); Rui Chen, Irvine, CA (US); Seung Hyuk Kang, San Diego, CA (US); Venugopal Boynapalli, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 413 days.

(21) Appl. No.: 18/156,975

(22) Filed: Jan. 19, 2023

(65) Prior Publication Data

US 2024/0250669 A1     Jul. 25, 2024

(51) Int. Cl.
| | |
|---|---|
| *H04B 1/40* | (2015.01) |
| *H03K 3/037* | (2006.01) |
| *H03K 19/20* | (2006.01) |
| *H03K 3/012* | (2006.01) |

(52) U.S. Cl.
CPC ........... *H03K 3/0372* (2013.01); *H03K 3/012* (2013.01); *H03K 19/20* (2013.01)

(58) Field of Classification Search
CPC ...... H03K 3/0372; H03K 3/012; H03K 19/20; H03K 3/037; G01R 31/318541; H04B 1/04; H04B 1/16; H04B 1/40
See application file for complete search history.

(56) References Cited

U.S. PATENT DOCUMENTS

| | | | |
|---|---|---|---|
| 9,680,450 B2* | 6/2017 | Bailey | H03K 3/0372 |
| 11,946,973 B1* | 4/2024 | Khawas | G01R 31/318552 |
| 11,967,958 B2* | 4/2024 | Chen | H03K 5/01 |
| 12,099,090 B2* | 9/2024 | Xian | H03K 3/35625 |
| 2017/0016955 A1* | 1/2017 | Kim | G01R 31/31727 |
| 2017/0325127 A1* | 11/2017 | Raghu | H04W 8/005 |
| 2020/0058681 A1* | 2/2020 | Lai | H10D 84/038 |
| 2020/0091608 A1 | 3/2020 | Alpman et al. | |
| 2021/0005633 A1 | 1/2021 | Lai et al. | |
| 2021/0020643 A1* | 1/2021 | Yang | H10D 30/6211 |
| 2021/0063489 A1* | 3/2021 | Watanabe | G01R 31/3177 |
| 2021/0397773 A1* | 12/2021 | Chen | G06N 3/063 |
| 2022/0108989 A1* | 4/2022 | Kang | H10D 86/60 |
| 2022/0115405 A1 | 4/2022 | Lim et al. | |
| 2022/0209774 A1* | 6/2022 | Liaw | H10B 10/18 |
| 2023/0104185 A1* | 4/2023 | Gerousis | G06F 30/392 |
| | | | 257/401 |

FOREIGN PATENT DOCUMENTS

KR     20200143586 A     12/2020

OTHER PUBLICATIONS

International Search Report and Written Opinion—PCT/US2023/084776—ISA/EPO—Apr. 29, 2024.

\* cited by examiner

*Primary Examiner* — Andrew Wendell
(74) *Attorney, Agent, or Firm* — Loza & Loza, LLP

(57) ABSTRACT

A hybrid flop tray, including: a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized with a second number of fins, wherein the first number of fins is different than the second number of fins; and a control circuit configured to provide control signals to the set of flip-flops.

19 Claims, 5 Drawing Sheets

HYBRID FLOP TRAY INCLUDING DIFFERENT FIN SIZE FLIP-FLOPS

FIELD

Aspects of the present disclosure relate generally to sequential circuits, and in particular, to a hybrid flop tray including different fin size flip-flops (F/F).

BACKGROUND

Integrated circuits (ICs) typically include flop trays to sequentially move functional and/or test data to and from functional circuits, such as combinational logic. In many cases, flop trays occupy a significant portion of an IC's footprint (e.g., about 80 percent (%) or more of the area of an IC). A reduction in size of a flop tray, while providing the same functionality, would result in substantial savings in IC footprint. Further, flop trays also consume a significant portion of the power consumed by an IC. Therefore, a reduction in the power consumed by a flop tray, while providing the same functionality, would result in substantial power savings for the IC.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a hybrid flop tray. The hybrid flop tray includes: a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized with a second number of fins, wherein the first number of fins is different than the second number of fins; and a control circuit configured to provide control signals to the set of flip-flops.

Another aspect of the disclosure relates to a wireless communication device. The wireless communication device includes: at least one antenna; a transceiver coupled to the at least one antenna; one or more signal processing cores coupled to the transceiver, wherein the one or more processing cores comprises a flop tray comprising: a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized a second number of fins, wherein the first number of fins is different than the second number of fins; and a control circuit configured to provide control signals to the set of flip-flops.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
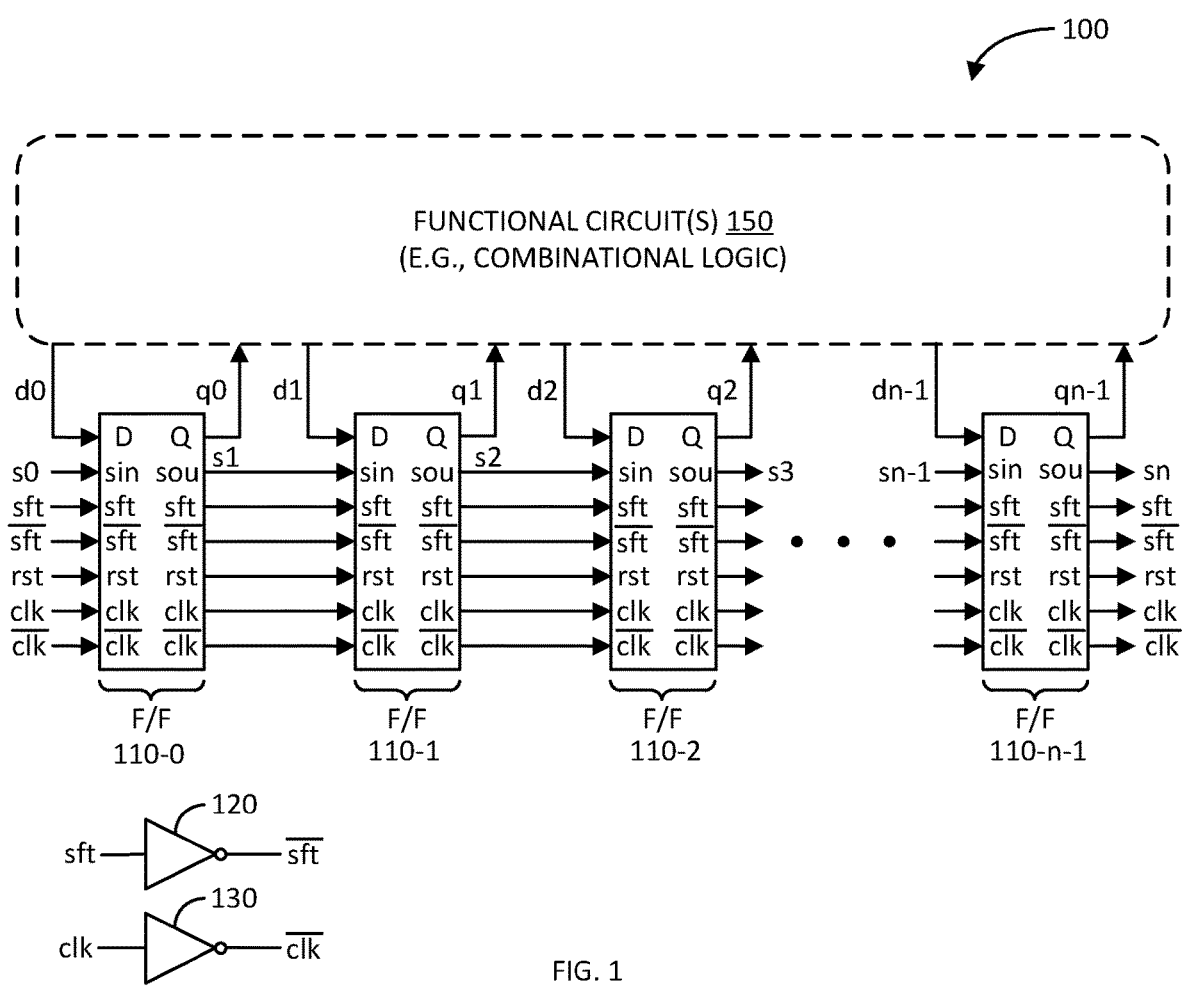
FIG. 1 illustrates a block diagram of an example flop tray in accordance with an aspect of the disclosure.

FIG. 1 illustrates a block diagram of an example flop tray 100 in accordance with an aspect of the disclosure. The flop tray 100 is an example sequential circuit for propagating functional and/or test data to and from one or more functional circuits 150 (e.g., combinational logic). For example, the flop tray 100 may be configured to propagate functional data to the one or more functional circuits or cores 150 of an integrated circuit (IC), such as a system on chip (SOC). The flop tray 100 may also be configured to propagate test data to inputs of the one or more functional circuits 150 in scan-in mode, and propagate resulting test data (obtained in capture mode) out from the one or more functional circuits 150 in scan-out mode.

In particular, the flop tray 100 includes a set of flip-flops (F/Fs) 110-0 to 110-$n$-1. The set of F/Fs 110-0 to 110-$n$-1 are cascaded with respect to a test data or scan path. For example, each of the F/Fs 110-0 to 110-$n$-1 includes a scan-in (sin) input and a scan-out (sou) output. The sou output of a F/F is coupled to a sin input of the following adjacent F/F. For instance, the F/F 110-0 includes an sou output coupled to a sin input of the following adjacent F/F 110-1; the F/F 110-1 includes an sou output coupled to a sin input of the following adjacent F/F 110-2; and so on, where the F/F 110-$n$-2 (not explicitly shown) includes an sou output coupled to a sin input of the following adjacent F/F 110-$n$-1.

Each of the set of F/Fs 110-0 to 110-$n$-1 includes a data input (D) and a data output (Q). The inputs (D) of the set of F/Fs 110-0 to 110-$n$-1 are configured to receive functional and/or test data d0 to dn-1 from the one or more functional circuits 150, respectively. The data outputs (Q) of the set of F/Fs 110-0 to 110-*n*-1 are configured to provide functional and/or test data q0 to qn-1 to the one or more functional circuits 150.

For example, in functional mode, the set of F/Fs 110-0 to 110-*n*-1 may receive functional data d0 to d*n*-1 from the one or more functional circuits 150 and provide the functional data q0 to q*n*-1 to the one or more functional circuits 150. In scan-in mode, a pattern of test data s0 to sn-1 may be provided to the sin inputs of the set of F/Fs 110-0 to 110-*n*-1, respectively. The set of F/Fs 110-0 to 110-*n*-1 may then be operated in capture mode to provide the pattern of test data q0 to qn-1 to the one or more functional circuits 150, and receiving resulting test data d0 to d*n*-1 from the one or more functional circuits 150. Then in scan-out mode, the resulting test data d0 to d*n*-1 may be clocked out via the sou output of the F/F 110-*n*-1.

Each of the set of F/Fs 110-0 to 110-*n*-1 includes a pair of complementary shift ports configured to receive and output complementary shift signals sft and $\overline{sft}$, respectively. For example, the complementary shift signals sft and $\overline{sft}$ may be provided to the left complementary shift ports of the F/F 110-0. The right complementary shift ports of the F/Fs 110-0 to 110-*n*-2 are coupled to the left complementary shift ports of F/Fs 110-1 to 110-*n*-1, respectively. Accordingly, the complementary shift signals sft and $\overline{sft}$ provided to the left complementary shift ports of the F/F 110-0, are relayed or propagated to the other F/Fs 110-1 to 110-*n*-1. The flop tray 100 may further include an inverter 120 configured to invert the non-complementary shift signal sft to generate the complementary shift signal $\overline{sft}$.

When the complementary shift signals sft and $\overline{sft}$ are not asserted (e.g., sft=0, $\overline{sft}$=1), the set of F/Fs 110-0 propagate the data d0 to d*n*-1 at the data (D) inputs to the data (Q) outputs as q0 to qn-1 and the sou outputs as s1 to sn in response to a clock (clk) signal, respectively. When the complementary shift signals sft and $\overline{sft}$ are asserted (e.g., sft=1, $\overline{sft}$=0), the set of F/Fs 110-0 propagate the test data s0 to s*n*-1 at the sin inputs to the data (Q) outputs as q0 to q*n*-1 and the sou outputs as s1 to sn in response to the clock (clk) signal, respectively.

Each of the set of F/Fs 110-0 to 110-*n*-1 includes a pair of complementary clock ports configured to receive and output complementary clock signals clk and $\overline{clk}$, respectively. For example, the complementary clock signals clk and $\overline{clk}$ may be provided to the left complementary clock ports of the F/F 110-0. The right complementary clock ports of the F/Fs 110-0 to 110-*n*-2 are coupled to the left complementary clock ports of F/Fs 110-1 to 110-*n*-1, respectively. Accordingly, the complementary clock signals clk and $\overline{clk}$, provided to the left complementary clock ports of the F/F 110-0, are relayed or propagated to the other F/Fs 110-1 to 110-*n*-1. The flop tray 100 may further include an inverter 130 configured to invert the non-complementary clock signal clk to generate the complementary clock signal $\overline{clk}$. The set of F/Fs 110-0 to 110-*n*-1 propagate data in response to the transition edges of the complementary clock signals clk and $\overline{clk}$, respectively.

Each of the set of F/Fs 110-0 to 110-*n*-1 includes a pair of reset (rst) ports configured to receive and output a reset (rst) signal. For example, the reset signal may be provided to the left rst port of the F/F 110-0. The right rst ports of the F/Fs 110-0 to 110-*n*-2 are coupled to the left rst ports of F/Fs 110-1 to 110-*n*-1, respectively. Accordingly, the reset signal, provided to the left rst port of the F/F 110-0, is relayed or propagates to the other F/Fs 110-1 to 110-*n*-1. When asserted (e.g., rst=1), the reset signal resets or anchors the data (Q) and sou outputs to a logic zero (0); when not asserted, the data at the data (Q) and sou outputs are controlled by the remaining data, scan, shift, and clock signals.

Figure 2:
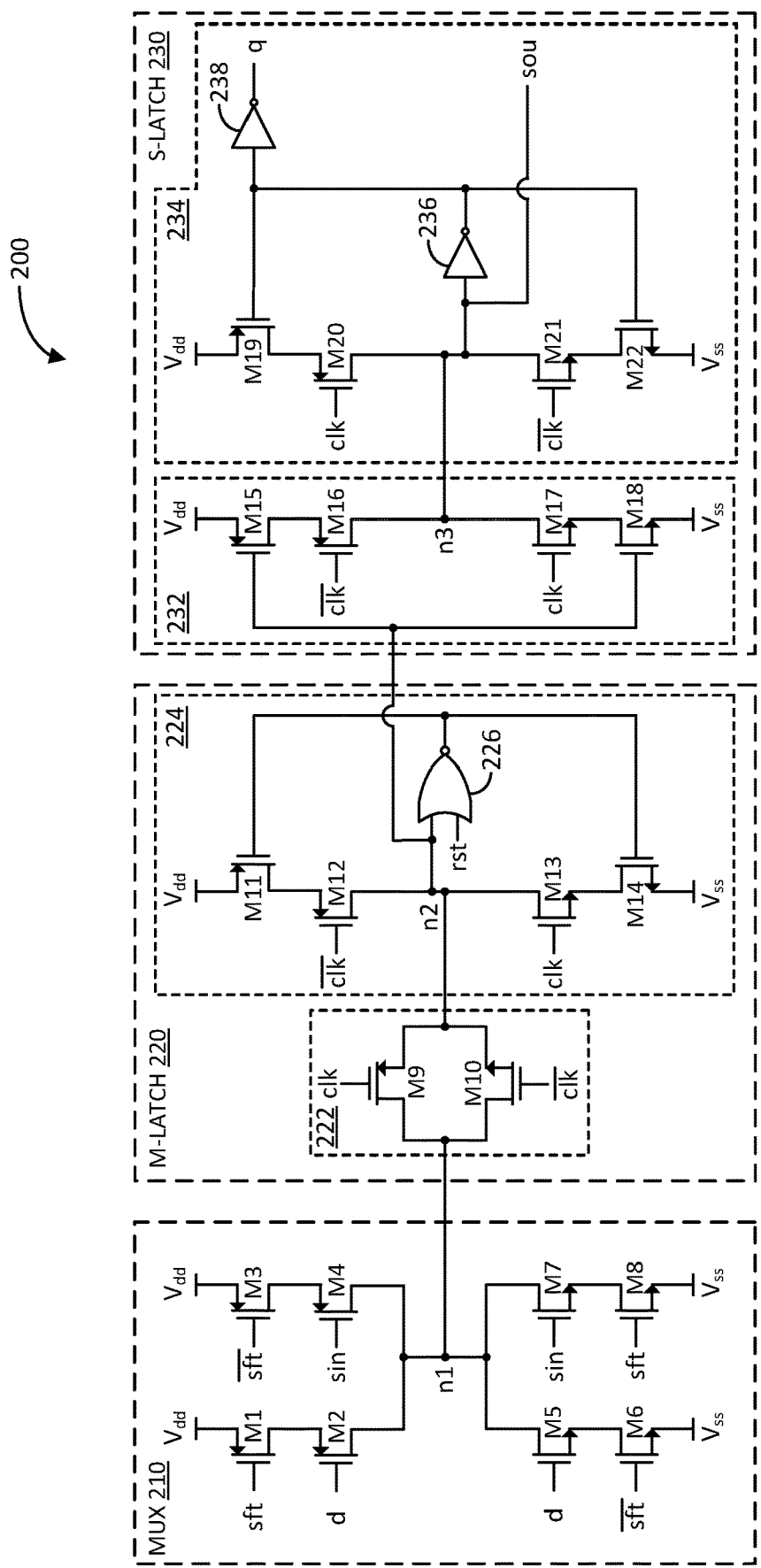
FIG. 2 illustrates a schematic diagram of an example flip-flop in accordance with another aspect of the disclosure.

FIG. 2 illustrates a schematic diagram of an example flip-flop (F/F) 200 in accordance with another aspect of the disclosure. The F/F 200 may be an example detailed implementation of one of the set of F/Fs 110-0 to 110-*n*-1 of flop tray 100. The F/F 200 includes a multiplexer (Mux) 210, a master latch (M-latch) 220, and a slave latch (S-latch) 230.

The multiplexer 210 is configured to output at a node n1 a selected one of an input data (d) or a scan data (sin) based on complementary shift signals sft and $\overline{sft}$. In particular, the multiplexer 210 includes a first field effect transistor (FET) M1 (e.g., which may be implemented as a p-channel metal oxide semiconductor FET or PMOS FET) coupled in series with a second FET M2 (e.g., PMOS FET) between an upper voltage rail $V_{dd}$ and the node n1. That is, the first FET M1 includes a source coupled to the upper voltage rail $V_{dd}$, a gate configured to receive the non-complementary shift signal sft, and a drain coupled to a source of the second FET M2. The second FET M2 includes a gate configured to receive the data signal (d), and a drain coupled to the node n1.

The multiplexer 210 further includes a third FET M3 (e.g., PMOS FET) coupled in series with a fourth FET M4 (e.g., PMOS FET) between the upper voltage rail $V_{dd}$ and the node n1. That is, the third FET M3 includes a source coupled to the upper voltage rail $V_{dd}$, a gate configured to receive the complementary shift signal $\overline{sft}$, and a drain coupled to a source of the fourth FET M4. The fourth FET M4 includes a gate configured to receive the scan signal (sin), and a drain coupled to the node n1.

Additionally, the multiplexer 210 includes a fifth FET M5 (e.g., which may be implemented as an n-channel metal oxide semiconductor FET or NMOS FET) coupled in series with a sixth FET M6 (e.g., NMOS FET) between the node n1 and a lower voltage rail $V_{ss}$ (e.g., ground). That is, the fifth FET M5 includes a drain coupled to the node n1, a gate configured to receive the data signal (d), and a source coupled to a drain of the sixth FET M6. The sixth FET M6 includes a gate configured to receive the complementary shift signal $\overline{sft}$, and a source coupled to the lower voltage rail $V_{ss}$.

The multiplexer 210 further includes a seventh FET M7 (e.g., NMOS FET) coupled in series with an eighth FET M8 (e.g., NMOS FET) between the node n1 and the lower voltage rail $V_{ss}$. That is, the seventh FET M7 includes a drain coupled to the node n1, a gate configured to receive the scan signal (sin), and a source coupled to a drain of the eighth FET M8. The eighth FET M8 includes a gate configured to receive the non-complementary shift signal sft, and a source coupled to the lower voltage rail $V_{ss}$.

In operation with regard to the multiplexer 210, when the shift signal is not asserted (e.g., sft=0, $\overline{sft}$=1), the first FET M1 is turned on, the third FET M3 is turned off, the sixth FET M6 is turned on, and the eight FET M8 is turned off. In this configuration, an electrical path responsive to the data signal (d) exists between the upper voltage rail $V_{dd}$ and the lower voltage rail $Vs_s$ via FETs M1, M2, M5, and M6 (e.g., no electrical path exists between $V_{dd}$ and $V_{ss}$ via FETs M3, M4, M7, and M8, as FETs M3 and M8 are turned off). Accordingly, the multiplexer 210 outputs the data signal (d) (e.g., albeit inverted) at node n1.

When the shift signal is asserted (e.g., sft=1, $\overline{sft}$=0), the first FET M1 is turned off, the third FET M3 is turned on, the sixth FET M6 is turned off, and the eight FET M8 is turned on. In this configuration, an electrical path responsive to the scan signal (sin) exists between the upper voltage rail $V_{dd}$ and the lower voltage rail $V_{ss}$ via FETs M3, M4, M7, and M8 (e.g., no electrical path exists between $V_{dd}$ and $V_{ss}$ via FETs M1, M2, M5, and M6, as FETs M1 and M6 are turned off). Accordingly, the multiplexer 210 outputs the scan signal (sin) (e.g., albeit inverted) at node n1.

The master latch 220 is configured to be transparent (e.g., receiving the (d) or (sin) signal outputted by the multiplexer 210) when the complementary clock signals clk and $\overline{\text{clk}}$ are logically low and high, and opaque (e.g., closed and latching the previously received (d) or (sin) signal) when the complementary clock signals clk and $\overline{\text{clk}}$ are logically high and low, respectively. In particular, the master latch 220 includes a transmission gate 222 including FET M9 (e.g., PMOS FET) and FET M10 (e.g., an NMOS FET) coupled in parallel between the node n1 and a node n2. That is, the FET M9 includes a source/drain coupled to node n1 and a drain/source coupled to node n2. Similarly, the FET M10 includes a drain/source coupled to node n1 and a source/drain coupled to node n2.

The FETs M9 and M10 are referred to as having drain/source and source/drain because these terms depend on which voltages at nodes n1 and n2 is higher. For example, if the voltage at node n1 (e.g., a logic one (1)) is higher than the voltage at node n2 (e.g., a logic zero (0)), then the FET M9 includes a source coupled node n1 and a drain coupled to node n2, and the FET M10 includes a drain coupled to node n1 and a source coupled to node n2. Conversely, if the voltage at node n1 (e.g., a logic zero (0)) is lower than the voltage (e.g., a logic one (1)) at node n2, then the FET M9 includes a drain coupled node n1 and a source coupled to node n2, and the FET M10 includes a source coupled to node n1 and a drain coupled to node n2.

The master latch 220 further includes a latch 224 including FET M11 (e.g., PMOS FET) coupled in series with FET M12 (e.g., PMOS FET) between the upper voltage rail V$dd$ and the node n2. That is, the FET M11 includes a source coupled to the upper voltage rail $V_{dd}$ and a drain coupled to a source of FET M12. The FET M12 includes a gate configured to receive the complementary clock signal $\overline{\text{clk}}$, and a drain coupled to node n2. The latch 224 further includes a FET M13 (e.g., NMOS FET) coupled in series with a FET M14 (e.g., NMOS FET) between the node n2 and the lower voltage rail $V_{ss}$. That is, the FET M13 includes a drain coupled to node n2, a gate configured to receive the non-complementary clock signal clk, and a source coupled to a drain of FET M14. The FET M14 includes a source coupled to the lower voltage rail $V_{ss}$. The latch 224 further includes a NOR gate 226 including a first input coupled to node n2, a second input configured to receive the reset (rst) signal, and an output coupled to the gates of FETs M11 and M14.

In operation with regard to the master latch 220, when the reset signal is not asserted (e.g., a logic zero (0)), the NOR gate 226 operates as an inverter. During this mode, when the complementary clock signals clk and $\overline{\text{clk}}$ are logically low and high, the transmission gate 222 is turned on; allowing the (d) or (sin) signal outputted by the multiplexer 210 to propagate to node n2 of the latch 224. Also, when the complementary clock signals clk and $\overline{\text{clk}}$ are respectively logically low and high, the FETs M12 and M13 are turned off to disable the latch 224. Conversely, when the complementary clock signals clk and $\overline{\text{clk}}$ are respectively logically high and low, the transmission gate 222 is turned off, thereby blocking the (d) or (sin) signal outputted by the multiplexer 210 from propagating to node n2 of the latch 224. Also, when the complementary clock signals clk and $\overline{\text{clk}}$ are respectively logically high and low, the FETs M12 and M13 are turned on to enable the latch 224 to hold the (d) or (sin) signal previously received from the multiplexer 210. When the reset signal is asserted (e.g., a logic one (1)), the NOR gate 226 outputs a logic zero (0); which causes node n2 to be at a logic one (1); which is subsequently inverted by the slave latch 230 to cause the data output (q) and scan output (sou) to be at logic zeros (0s).

The slave latch 230 is configured to be transparent (e.g., receiving the (d) or (sin) signal outputted by the master latch 220) when the complementary clock signals clk and $\overline{\text{clk}}$ are logically high and low, and opaque (e.g., closed and latching the previously received (d) or (sin) signal) when the complementary clock signals clk and $\overline{\text{clk}}$ are logically low and high, respectively.

In particular, the slave latch 230 includes a gated inverter 232 and a latch 234. The gated inverter 232 includes a FET M15 (e.g., PMOS FET) coupled in series with a FET M16 (e.g., PMOS FET) between the upper voltage rail $V_{dd}$ and a node n3. That is, the FET M15 includes a source coupled to the upper voltage rail $V_{dd}$, a gate coupled to node n2, and a drain coupled to a source of FET M16. The FET M16 includes a gate configured to receive the complementary clock signal $\overline{\text{clk}}$, and a drain coupled to node n3. The gated inverter 232 further includes a FET M17 (e.g., NMOS FET) coupled in series with a FET M18 (e.g., NMOS FET) between node n3 and the lower voltage rail $V_{ss}$. That is, the FET M17 includes a drain coupled to node n3, a gate configured to receive the non-complementary clock signal clk, and a source coupled to a drain of FET M18. The FET M18 includes a gate coupled to node n2, and a source coupled to the lower voltage rail $V_{ss}$.

The latch 234, in turn, includes a FET M19 (e.g., PMOS FET) coupled in series with a FET M20 (e.g., PMOS FET) between the upper voltage rail $V_{dd}$ and node n3. That is, the FET M19 includes a source coupled to the upper voltage rail $V_{dd}$, and a drain coupled to a source of FET M20. The FET M20 includes a gate configured to receive the non-complementary clock signal clk, and a drain coupled to node n3. The latch 234 further includes a FET M21 (e.g., NMOS FET) coupled in series with a FET M22 (e.g., NMOS FET) between node n3 and the lower voltage rail $V_{ss}$. That is, the FET M21 includes a drain coupled to node n3, a gate configured to receive the complementary clock signal $\overline{\text{clk}}$, and a source coupled to a drain of FET M22. The FET M22 includes a source coupled to the lower voltage rail $V_{ss}$. The latch 234 further includes a first inverter 236 including an input coupled to node n3, and an output coupled to gates of the FETs M19 and M22. Additionally, the latch 234 may include a second inverter 238 with an input coupled to the output of the first inverter 236 and an output configured to generate a data output signal (q). A scan output signal (sou) is generated at node n3.

In operation with regard to the slave latch 230, when the complementary clock signals clk and $\overline{\text{clk}}$ are logically high and low, the gated inverter 232 is turned on; allowing the (d) or (sin) signal at node n2 to propagate to and be inverted at node n3 of the latch 234. Also, when the complementary clock signals clk and $\overline{\text{clk}}$ are respectively logically high and low, the FETs M20 and M21 are turned off to disable the latch 234. Conversely, when the complementary clock signals clk and $\overline{\text{clk}}$ are respectively logically low and high, the gated inverter 232 is turned off, thereby blocking the (d) or (sin) signal outputted by the master latch 220 from propagating to node n3 of the latch 234. Also, when the complementary clock signals clk and $\overline{\text{clk}}$ are respectively logically low and high, the FETs M20 and M21 are turned on to enable the latch 234 to hold the (d) or (sin) signal previously received from the master latch 220.

In summary, when the clock signal clk experiences a rising edge, the master latch 220 becomes opaque and latches the current signal previously received from the multiplexer 210, and the slave latch 230 becomes transparent and receives the current signal at node n3. When the clock signal clk experiences a falling edge, the master latch 220 becomes transparent and receives a new signal at node n2, and the slave latch 230 becomes opaque and latches the current signal it previously received from the master latch 220.

The FETs M1 to M22 including FETs in the NOR gate 226 and the inverters 236 and 238 of the F/F 200 may be implemented per the same size or same channel width to length ratio (W/L). For example, if such FETs are implemented as FinFETs, the FETs may be sized with the same number of fins (e.g., two (2) fins). Thus, the set of F/Fs 110-0 to 110-n-1 of the flop tray 100 may each be implemented with the same 2-fin FinFETs.

However, as technology nodes continue to decrease in ICs that use flop trays, the percent usage of flop trays in such ICs tend to increase. As the percent usage of flop trays increase, the IC footprint to implement flop trays also likewise increased. Further, as the percent usage of flop trays in ICs continue to increase, the amount of power consumed by flop trays also increases. Thus, there is a need to meet newer technology nodes preference for increased flop trays, while utilizing IC footprint efficiently to implement the increasing number of flop trays, and implementing flop trays for improved power efficiency.

Figure 3:
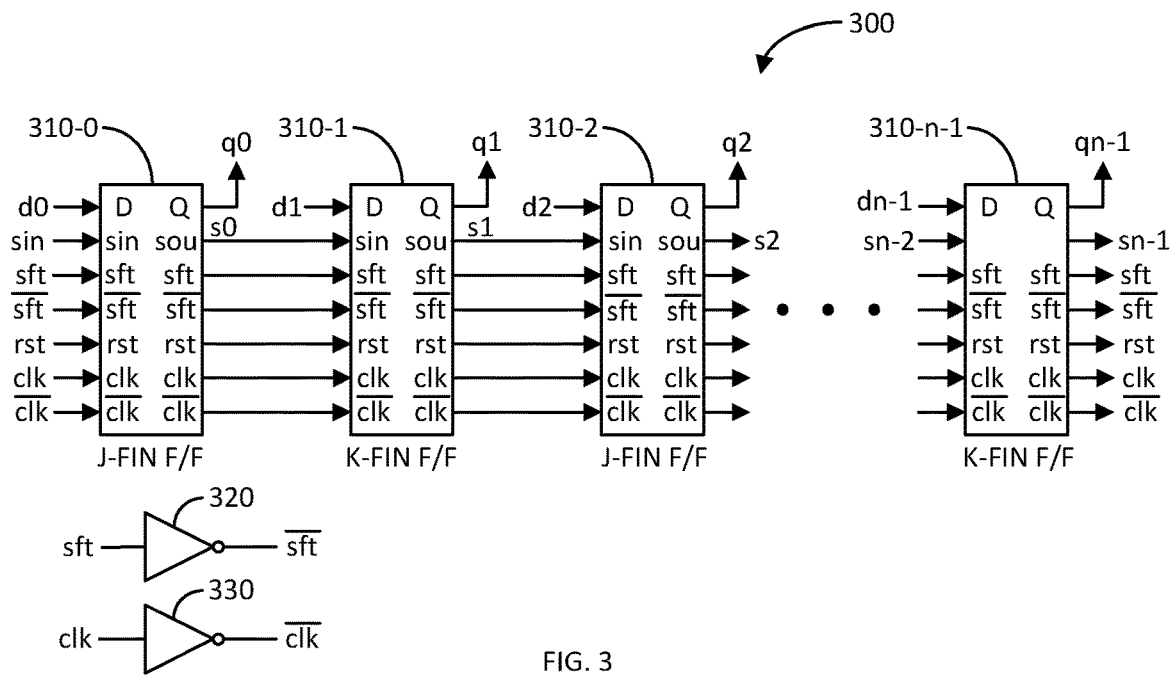
FIG. 3 illustrates a block diagram of an example hybrid flop tray in accordance with another aspect of the disclosure.

FIG. 3 illustrates a block diagram of an example hybrid flop tray 300 in accordance with an aspect of the disclosure. The hybrid flop tray 300 includes a set of flip-flops (F/Fs) 310-0 to 310-n-1 similar to the set of F/Fs 110-0 to 110-n-1 previously discussed. Similar to the set of F/Fs 110-0 to 110-n-1, the set of F/Fs 310-0 to 310-n-1 include a set of data inputs (D) configured to receive data signals (e.g., functional or scan) d0 to dn-1, respectively. The set of F/Fs 310-0 to 310-n-1 include a set of data outputs (Q) configured to output data signals (e.g., functional or scan) q0 to qn-1, respectively. The set of F/Fs 310-0 to 310-n-1 are cascaded with respect to a scan path wherein the scan outputs (sou) of F/Fs 310-0 to 310-n-2 are electrically coupled to the scan inputs (sin) of F/Fs 310-1 to 310-n-1, respectively.

The set of F/Fs 310-0 to 310-n-1 include ports configured to receive the various control signals, such as complementary shift signals sft/$\overline{sft}$, a reset (rst) signal, and complementary clock signals clk/$\overline{clk}$. The shift sft/$\overline{sft}$, reset, and clock clk/$\overline{clk}$ ports of the set of F/Fs 310-0 to 310-n1 are electrically coupled together, respectively. Additionally, the hybrid flop tray 300 includes a first inverter 320 configured to receive and invert the non-complementary shift signal sft to generate the complementary shift signal $\overline{sft}$. Similarly, the hybrid flop tray 300 further includes a second inverter 330 configured to receive and invert the non-complementary clock signal clk to generate the complementary clock signal $\overline{clk}$.

In hybrid flop tray 300, the set of F/Fs 310-0 to 310-n-1 include a set of hybrid F/Fs implemented with FinFETs sized to have different number of fins. For example, a first subset of at least F/Fs 310-0 and 310-2 of the set of F/Fs 310-0 to 310-n-1 each includes a set of FinFETs, such as the set of FinFETs M1 to M22 (including FinFETs in the NOR gate 226 and inverters 236 and 238 of F/F 200), sized with J number of fins, where J is a positive integer. A second subset of at least another F/Fs 310-1 and 310-n-1 of the set of F/Fs 310-0 to 310-n-1 each includes a set of FinFETs, such as the set of FinFETs M1 to M22 (including FinFETs in the NOR gate 226 and inverters 236 and 238 of F/F 200), sized with K number of fins, where K is a positive integer different than J.

That is, instead of implementing the set of F/Fs 310-0 to 310-n-1 each with FinFETs sized with the same number of fins, the hybrid flop tray 300 includes a hybrid set of F/Fs 310-0 to 310-n-1 with FinFETs sized with different number of fins. As an example, a flop tray may include a set of F/Fs with FinFETs sized with a uniform minimum number of fins (e.g., 2 fins) to meet timing closure requirements. The D2Q propagation delay (the delay associated with the propagation of data from the data (D) input to the data (Q) output) of a F/F may be directly related to the number of fins of its set of FinFETs. For example, the D2Q of a F/F implemented with 2-fin FinFETs may have a D2Q delay of 103 picoseconds (ps). If the flop tray is implemented with a set of F/Fs with FinFETs sized with a uniform smaller number of fins (e.g., 1 fin), the flop tray may not be able to meet the timing closure requirements due to the high D2Q delay of the 1-fin F/F. For example, the D2Q of a F/F implemented with 1-fin FinFETs may have a D2Q delay of 145 ps.

However, the timing closure requirement for a flop tray may be met if the D2Q of each of the F/Fs were at 135 ps. Thus, the hybrid flop tray 300 may be implemented with a first subset including half of the set of F/Fs 310-0, 310-2, 310-4, and 310-6 (where n=8) using 1-fin FinFETs, and a second subset including the other half of the set of F/Fs 310-1, 310-3, 310-5, and 310-7 with 2-fin FinFETs. In this configuration, the average D2Q per F/F of the hybrid flop tray 300 would be substantially the average of the D2Q for the 1-fin F/F (e.g., 145 ps) and the D2Q of the 2-fin F/F (e.g., 103 ps), which would be 124 ps. The 124 average D2Q for the hybrid flop tray 300 would meet the timing closure requirement of 135 ps.

An advantage of the hybrid flop tray 300 is that by replacing some of the 2-fin F/Fs of a flop tray with 1-fin F/Fs, there may be substantial savings in IC footprint to implement flop trays. For example, a 1-fin IC cell may have a height of 117 nanometers (nm), whereas a 2-fin IC cell may have a height of 169 nm. Thus, considering the example above, instead of having a flop tray with eight (8) F/F cells of uniform 2-fin FETs, a flop tray may be implemented with four (4) F/Fs using 1-fin FETs and four (4) using 2-fin FETs, saving substantial IC footprint.

Another advantage of the hybrid flop tray 300 is that higher fin FinFETs consume more power than lower fin FinFETs. For example, a 2-fin F/F may consume 21 percent (%) more power than a 1-fin F/F. Thus, substantial amount of power may be saved by using the hybrid flop tray 300 instead of a flop tray that uses a uniform higher number of fins devices. In the example hybrid flop tray 300, the set of F/Fs 310-0 to 310-n-1 are implemented with two different fin number FETs J and K. However, it shall be understood that a flop tray may be implemented with F/Fs using devices of more than two different number of fin devices (e.g., one of more F/Fs using 1-fin devices, one or more F/Fs using 2-fin devices, and one or more F/Fs using 3-fin devices).

Figure 4:
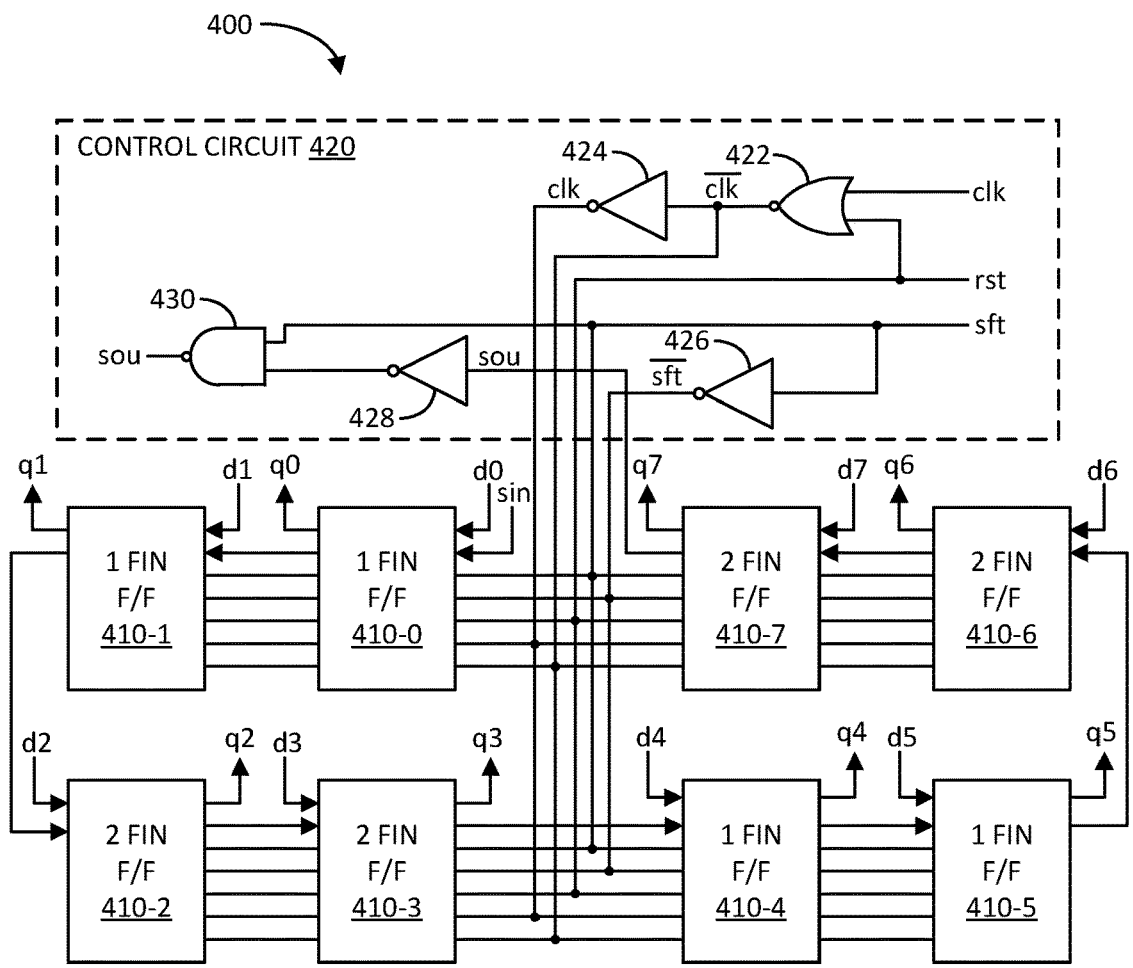
FIG. 4 illustrates a block/schematic diagram of another example hybrid flop tray in accordance with another aspect of the disclosure.

FIG. 4 illustrates a block/schematic diagram of another example hybrid flop tray 400 in accordance with another aspect of the disclosure. The hybrid flop tray 400 is an example configuration of the hybrid flop tray 300 previously discussed. The hybrid flop tray 400 includes a set of flip-flops (F/Fs) 410-0 to 410-7. The F/Fs 410-0, 410-1, 410-4, and 410-5 use FinFETs of 1-fin size, and the F/Fs 410-2, 410-3, 410-6, and 410-7 use FinFETs of 2-fin size.

Similar to hybrid flop tray 300, the set of F/Fs 410-0 to 410-7 include a set of data inputs (D) configured to receive data signals (e.g., functional or scan) d0 to d7, respectively. The set of F/Fs 410-0 to 410-7 include a set of data outputs (Q) configured to output data signals (e.g., functional or scan) q0 to q7, respectively. The set of F/Fs 410-0 to 410-7 are cascaded with respect to a scan path wherein the scan outputs (sou) of F/Fs 410-0 to 410-6 are coupled to the scan inputs (sin) of F/Fs 410-1 to 410-7, respectively.

The hybrid flop tray 400 includes a control circuit 420 configured to generate various control signals for the set of F/Fs 410-0 to 410-7. For example, the control circuit 420 includes a NOR gate 422 including inputs configured to receive a non-complementary clock signal clk and a reset (rst) signal, respectively. When the reset signal is not asserted (e.g., a logic zero (0)), the NOR gate 422 is configured to output a complementary clock signal $\overline{clk}$ for the complementary clock port of the set of F/Fs 410-0 to 410-7. That is, the NOR gate 422 includes an output coupled to the complementary clock port of at least one of the set of F/Fs 410-0 to 410-7 (e.g., F/Fs 410-0, 410-3, 410-7, and 410-4), and the complementary clock signal $\overline{clk}$ is relayed by the at least one F/F to at least another F/F (e.g., from F/Fs 410-0, 410-3, 410-7, and 410-4 to F/Fs 410-1, 410-2, 410-6, and 410-5), respectively.

The control circuit 420 further includes an inverter 424 including an input coupled to the output of the NOR gate 422. When the reset signal is not asserted, the inverter 424 is configured to invert the complementary clock signal $\overline{clk}$ to generate the non-complementary clock signal clk. The inverter 424 includes an output coupled to the non-complementary clock port of at least one of the set of F/Fs 410-0 to 410-7 (e.g., F/Fs 410-0, 410-3, 410-7, and 410-4), and the non-complementary clock signal clk is relayed by the at least one F/F to at least another F/F (e.g., from F/Fs 410-0, 410-3, 410-7, and 410-4 to F/Fs 410-1, 410-2, 410-6, and 410-5), respectively.

When the reset signal is asserted (e.g., a logic one (1)), the NOR gate 422 outputs a logic zero (0) for the complementary clock ports of the set of F/Fs 410-0 to 410-7 (e.g., effectively disabling the generation of the complementary clock signal $\overline{clk}$). The inverter 424 inverts the logic zero (0) generated by the NOR gate 422 to produce a logic one (1) for the non-complementary ports of the set of F/F 410-0 to 410-7 (e.g., effectively disabling the generation of the non-complementary clock signal clk). The asserted reset signal is also provided to a reset port of at least one of the set of F/Fs 410-0 to 410-7 (e.g., F/Fs 410-0, 410-3, 410-7, and 410-4), and the reset signal is relayed by the at least one F/F to at least another F/F (e.g., from F/Fs 410-0, 410-3, 410-7, and 410-4 to F/Fs 410-1, 410-2, 410-6, and 410-5), respectively. The asserted reset signal anchors the data outputs q0 to q7 and the sou outputs of the set of 410-0 to 410-7 each at a logic zero (0).

The control circuit 420 further includes an inverter 426 including an input configured to receive a non-complementary shift signal sft, and an output configured to produce a complementary shift signal $\overline{sft}$. The non-complementary shift signal sft is also provided to the non-complementary shift signal port of at least one of the set of F/Fs 410-0 to 410-7 (e.g., F/Fs 410-0, 410-3, 410-7, and 410-4), and the non-complementary shift signal sft is relayed by the at least one F/F to at least another F/F (e.g., from F/Fs 410-0, 410-3, 410-7, and 410-4 to F/Fs 410-1, 410-2, 410-6, and 410-5), respectively. The inverter 426 includes an output coupled to the complementary shift signal port of at least one of the set of F/Fs 410-0 to 410-7 (e.g., F/Fs 410-0, 410-3, 410-7, and 410-4), and the complementary shift signal $\overline{sft}$ is relayed by the at least one F/F to at least another F/F (e.g., from F/Fs 410-0, 410-3, 410-7, and 410-4 to F/Fs 410-1, 410-2, 410-6, and 410-5), respectively.

Additionally, the control circuit 420 includes another inverter 428 and a NAND gate 430. The inverter 428 includes an input coupled to the sou output of the F/F 410-7, and an output coupled to a first input of the NAND gate 430. The NAND gate 430 includes a second input configured to receive the non-complementary shift signal sft, and an output configured to produce the sou signal. When the non-complementary shift signal sft is not asserted (e.g., a logic zero (0)), the NAND gate 430 anchors its output at a logic one (1) (e.g., disabling the shift mode). When the non-complementary shift signal sft is asserted (e.g., a logic one (1)), the NAND gate 430 outputs the scan data via the sou output (e.g., enabling the shift mode).

The devices of the control circuit 420 (e.g., namely the NOR gate 422, inverters 424, 426, and 428, and NAND gate 430) may each be implemented using a higher number fin (e.g., 2-fin) FinFETs as they may be more critical to the timing control of the set of F/Fs 410-0 to 410-7.

Figure 5A:
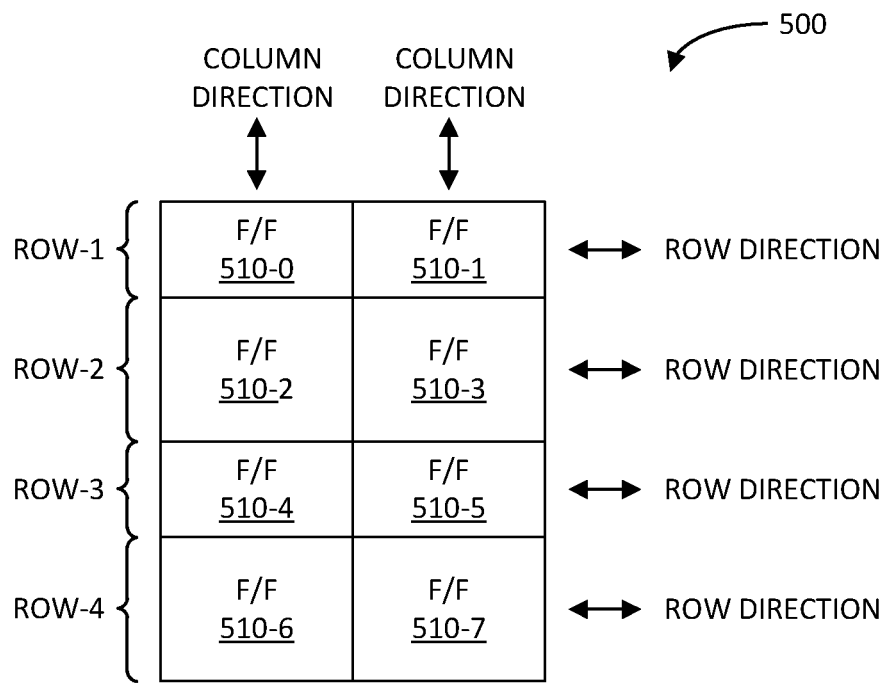
FIG. 5A illustrates a layout view of another example hybrid flop tray in accordance with another aspect of the disclosure.

FIG. 5A illustrates a layout view of another example hybrid flop tray 500 in accordance with another aspect of the disclosure. The hybrid flop tray 500 may be an example layout of the set of F/Fs 410-0 to 410-7 of the hybrid flop tray 400 previously discussed. The hybrid flop tray 500 may be implemented on four (4) rows of integrated circuit (IC) cells ROW-1 to ROW-4. IC cell rows ROW-1 and ROW-3 may have a height (e.g., 117 nm) of 1-fin IC cells, and IC cell rows ROW-2 and ROW-4 may have a height (e.g., 169 nm) of 2-fin IC cells.

In accordance with the layout, the hybrid flop tray 500 includes sequentially adjacent bits "0" and "1" (1-fin) flip-flops (F/Fs) 510-0 and F/F 510-1 adjacent or abutted to each other in the row direction in IC cell ROW-1. Sequentially adjacent bits means that the bits are numerically in (ascending or descending) order or consecutive, as in 0 and 1, or 3 and 2, or 4 and 5, etc. The hybrid flop tray 500 may further include sequentially adjacent bits "2" and "3" (2-fin) F/Fs 510-2 and F/F 510-3 adjacent or abutted to each other in the row direction in IC cell ROW-2, and substantially aligned with the 1-fin F/Fs 510-0 and 510-1 in the column direction, respectively. Additionally, the hybrid flop tray 500 includes sequentially adjacent bits "4" and "5" (1-fin) F/Fs 510-4 and 510-5 adjacent or abutted to each other in the row direction in IC cell ROW-3, and substantially aligned with the 2-fin F/Fs 510-2 and 510-3 in the column direction, respectively. Also, the hybrid flop tray 500 includes sequentially adjacent bits "6" and "7" (2-fin) F/Fs 510-6 and 510-7 adjacent or abutted to each other in the row direction in IC cell ROW-4, and substantially aligned with the 2-fin F/Fs 510-4 and 510-5 in the column direction, respectively.

It shall be understood that the layout configuration of hybrid flop tray 500 may be different, and the cascaded arrangement of the F/Fs 510-0 to 510-7 need not be two 1-fin F/Fs, two 2-fin F/Fs, two 1-fin F/Fs, and two 2-fin F/Fs, but could be in other cascaded arrangements. Further, the layout of hybrid flop tray 500 need not be spread over four (4) rows, but rather two rows of 1-fin and 2-fin heights. For the sake of layout diversity, another example layout for a hybrid flop tray is described below.

Figure 5B:
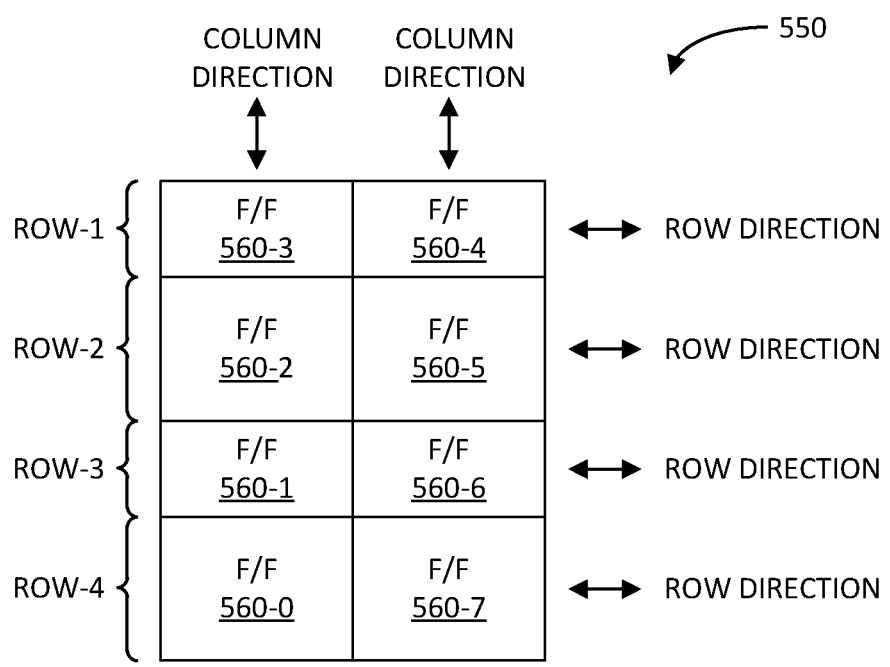
FIG. 5B illustrates a layout view of another example hybrid flop tray in accordance with another aspect of the disclosure.

FIG. 5B illustrates a layout view of another example hybrid flop tray 5500 in accordance with another aspect of the disclosure. The hybrid flop tray 550 may be another example layout of the set of F/Fs 410-0 to 410-7 of the hybrid flop tray 400 previously discussed. The hybrid flop tray 550 may be implemented on four (4) rows of integrated circuit (IC) cells ROW-1 to ROW-4. IC cell rows ROW-1 and ROW-3 may have a height (e.g., 117 nm) of 1-fin IC cells, and IC cell rows ROW-2 and ROW-4 may have a height (e.g., 169 nm) of 2-fin IC cells.

In accordance with the layout, the hybrid flop tray 550 includes sequentially adjacent bits "3" and "4" (1-fin) flip-flops (F/Fs) 560-3 and F/F 560-4 adjacent or abutted to each other in the row direction in IC cell ROW-1. The hybrid flop tray 550 may further include non-sequential bits "2" and "5" (2-fin) F/Fs 560-2 and F/F 560-3 adjacent or abutted to each other in the row direction in IC cell ROW-2, and substantially aligned with the 1-fin F/Fs 560-3 and 560-4 in the column direction, respectively. Additionally, the hybrid flop tray 550 includes non-sequential bits "1" and "6" (1-fin) F/Fs 560-1 and 560-6 adjacent or abutted to each other in the row direction in IC cell ROW-3, and substantially aligned with the 2-fin F/Fs 560-2 and 560-5 in the column direction, respectively. Also, the hybrid flop tray 550 includes non-sequential bits "0" and "7" (2-fin) F/Fs 560-0 and 560-7 adjacent or abutted to each other in the row direction in IC cell ROW-4, and substantially aligned with the 2-fin F/Fs 560-1 and 560-6 in the column direction, respectively.

Figure 6:
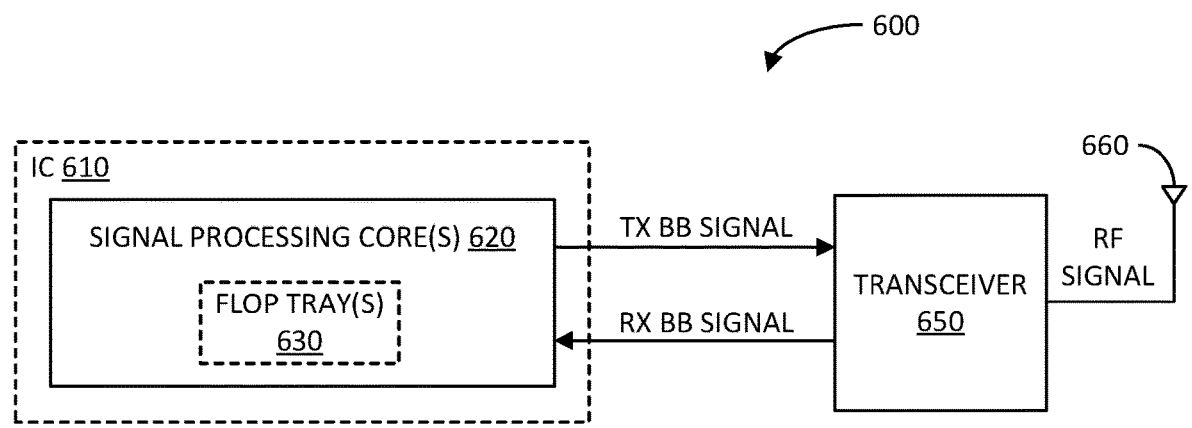
FIG. 6 illustrates a block diagram of an example wireless communication device in accordance with another aspect of the disclosure.

FIG. 6 illustrates a block diagram of an example wireless communication device 600 in accordance with another aspect of the disclosure. The wireless communication device 600 may be a smart phone, a desktop computer, laptop computer, tablet device, Internet of Things (IoT), wearable wireless device (e.g., wireless watch), and other types of wireless device.

In particular, the wireless communication device 600 includes an integrated circuit (IC) 610, which may be implemented as a system on chip (SOC). The IC 610 includes one or more signal processing cores 620, which may in turn, include one or more flop trays 630. Each of the one or more flop trays 630 may be implemented per any of the hybrid flop trays 300, 400, or 500 described herein. The one or more signal processing cores 620 may be configured to generate a transmit (Tx) baseband (BB) signal and process a received (Rx) baseband (BB) signal.

The wireless communication device 600 may further include a transceiver 650 and at least one antenna 660 (e.g., an antenna array). The transceiver 650 is coupled to the one or more signal processing cores 620 to receive therefrom the Tx BB signal and provide thereto the Rx BB signal. The transceiver 650 is configured to convert the Tx BB signal into a Tx radio frequency (RF) signal, and convert an Rx RF signal into the Rx BB signal. The transceiver 650 is coupled to the at least one antenna 660 to provide thereto the Tx RF signal for electromagnetic radiation into a wireless medium for wireless transmission, and receive the Rx RF signal electromagnetically picked up from the wireless medium by the at least one antenna 660.

The following provides an overview of aspects of the present disclosure:

Aspect 1: A hybrid flop tray, comprising: a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized with a second number of fins, wherein the first number of fins is different than the second number of fins; and a control circuit configured to provide control signals to the set of flip-flops.

Aspect 2: The hybrid flop tray of aspect 2, wherein the first number is one (1), and the second number is two (2).

Aspect 3: The hybrid flop tray of aspect 2, wherein the first subset of one or more flip-flops is associated with a first adjacent pair of sequential bits, and wherein the second subset of one or more flip-flops is associated with a second adjacent pair of sequential bits.

Aspect 4: The hybrid flop tray of aspect 3, wherein the first adjacent pair of sequential bits are sequentially adjacent to the second adjacent pair of sequential bits.

Aspect 5: The hybrid flop tray of aspect 4, wherein: the first subset of one or more flip-flops associated with the first adjacent pair of sequential bits are situated adjacent to each other in a first row of integrated circuit (IC) cells; and the second subset of one or more flip-flops associated with the second adjacent pair of sequential bits are situated adjacent to each other in a second row of IC cells.

Aspect 6: The hybrid flop tray of aspect 5, wherein the first subset of one or more flip-flops associated with the first adjacent pair of sequential bits are substantially aligned in a column direction with the second subset of one or more flip-flops associated with the second adjacent pair of sequential bits.

Aspect 7: The hybrid flop tray of any one of aspects 2-6, wherein the first subset of one or more flip-flops is further associated with a third adjacent pair of sequential bits, and wherein the second subset of one or more flip-flops is associated with a fourth adjacent pair of sequential bits.

Aspect 8: The hybrid flop tray of aspect 7, wherein: the second adjacent pair of sequential bits are sequentially adjacent to the first and third adjacent pairs of sequential bits; and the third adjacent pair of sequential bits is sequentially adjacent to the fourth adjacent pair of sequential bits.

Aspect 9: The hybrid flop tray of aspect 8, wherein: the first subset of one or more flip-flops associated with the first adjacent pair of sequential bits are situated adjacent to each other in a first row of integrated circuit (IC) cells; the second subset of one or more flip-flops associated with the second adjacent pair of sequential bits are situated adjacent to each other in a second row of IC cells; the first subset of one or more flip-flops associated with the third adjacent pair of sequential bits are situated adjacent to each other in a third row of IC cells; and the second subset of one or more flip-flops associated with the fourth adjacent pair of sequential bits are situated adjacent to each other in a fourth row of IC cells.

Aspect 10: The hybrid flop tray of aspect 9, wherein the first, second, third, and fourth subset of one or more flip-flops associated with the first, second, third, and fourth adjacent pairs of sequential bits are substantially aligned in a column direction, respectively.

Aspect 11: The hybrid flop tray of any one of aspects 1-10, wherein the control circuit includes FinFETs each sized with the second number of fins.

Aspect 12: The hybrid flop tray of any one of aspects 1-11, wherein the control circuit is configured to provide a non-complementary clock signal and a complementary clock signal to the set of flip-flops.

Aspect 13: The hybrid flop tray of aspect 12, wherein the control circuit comprises: a NOR gate includes a first input configured to receive the first clock signal, a second input configured to receive a reset signal, and an output coupled to a first clock port of each of the set of flip-flops; and an inverter including an input coupled to the output of the NOR gate, and an output coupled to a second clock port of each of the set of flip-flops.

Aspect 14: The hybrid flop tray of aspect 13, wherein at least one of the NOR gate or the inverter each includes a set of FinFETs each sized with the second number of fins.

Aspect 15: The hybrid flop tray of any one of aspects 1-14, wherein the control circuit is configured to provide first and second shift signals to the set of flip-flops, wherein the first shift signal is complementary to the second shift signal.

Aspect 16: The hybrid flop tray of aspect 15, wherein each of the set of flip-flops includes a first shift port configured to receive the first shift signal, and wherein the control circuit comprises a first inverter including an input configured to receive the first shift signal, and an output coupled to a second shift port of each of the set of flip-flops.

Aspect 17: The hybrid flop tray of aspect 16, wherein the first inverter includes a set of FinFETs each sized with the second number of fins.

Aspect 18: The hybrid flop tray of any one of aspects 15-17, wherein the control circuit comprises: a second inverter including an input coupled to a scan output of one of the set of flip-flops; and a NAND gate including a first input coupled to an output of the second inverter, a second input configured to receive the first shift signal, and an output configured to generate a scan out signal.

Aspect 19: The hybrid flop tray of aspect 18, wherein at least one of the second inverter or the NAND gate each includes a set of FinFETs each sized with the second number of fins.

Aspect 20: A wireless communication device, comprising: at least one antenna; a transceiver coupled to the at least one antenna; one or more signal processing cores coupled to the transceiver, wherein the one or more processing cores comprises a flop tray comprising: a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized a second number of fins, wherein the first number of fins is different than the second number of fins; and a control circuit configured to provide control signals to the set of flip-flops.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A hybrid flop tray, comprising:
   a set of flip-flops cascaded along a scan path, wherein a first subset of one or more of the flip-flops of the set include fin field effect transistors (FinFETs) each sized with a first number of fins, and a second subset of one or more of the flip-flops of the set include FinFETs each sized with a second number of fins, wherein the first number of fins is different than the second number of fins; and
   a control circuit configured to provide control signals to the set of flip-flops, wherein the control circuit is configured to provide first and second shift signals to the set of flip-flops, wherein the first shift signal is complementary to the second shift signal.

2. The hybrid flop tray of claim 1, wherein the first number is one (1), and the second number is two (2).

3. The hybrid flop tray of claim 2, wherein the first subset of one or more flip-flops is associated with a first adjacent pair of sequential bits, and wherein the second subset of one or more flip-flops is associated with a second adjacent pair of sequential bits.

4. The hybrid flop tray of claim 3, wherein the first adjacent pair of sequential bits are sequentially adjacent to the second adjacent pair of sequential bits.

5. The hybrid flop tray of claim 4, wherein:
   the first subset of one or more flip-flops associated with the first adjacent pair of sequential bits are situated adjacent to each other in a first row of integrated circuit (IC) cells; and
   the second subset of one or more flip-flops associated with the second adjacent pair of sequential bits are situated adjacent to each other in a second row of IC cells.

6. The hybrid flop tray of claim 5, wherein the first subset of one or more flip-flops associated with the first adjacent pair of sequential bits are substantially aligned in a column direction with the second subset of one or more flip-flops associated with the second adjacent pair of sequential bits, respectively.

7. The hybrid flop tray of claim 2, wherein the first subset of one or more flip-flops is further associated with a third adjacent pair of sequential bits, and wherein the second subset of one or more flip-flops is associated with a fourth adjacent pair of sequential bits.

8. The hybrid flop tray of claim 7, wherein:
   the second adjacent pair of sequential bits are sequentially adjacent to the first and third adjacent pairs of sequential bits; and
   the third adjacent pair of sequential bits is sequentially adjacent to the fourth adjacent pair of sequential bits.

9. The hybrid flop tray of claim 8, wherein:
   the first subset of one or more flip-flops associated with the first adjacent pair of sequential bits are situated adjacent to each other in a first row of integrated circuit (IC) cells;
   the second subset of one or more flip-flops associated with the second adjacent pair of sequential bits are situated adjacent to each other in a second row of IC cells;
   the first subset of one or more flip-flops associated with the third adjacent pair of sequential bits are situated adjacent to each other in a third row of IC cells; and
   the second subset of one or more flip-flops associated with the fourth adjacent pair of sequential bits are situated adjacent to each other in a fourth row of IC cells.

10. The hybrid flop tray of claim 9, wherein the first, second, third, and fourth subsets of one or more flip-flops associated with the first, second, third, and fourth adjacent pairs of sequential bits are substantially aligned in a column direction, respectively.

11. The hybrid flop tray of claim 1, wherein the control circuit includes FinFETs each sized with the second number of fins.

12. The hybrid flop tray of claim 1, wherein the control circuit is configured to provide first and second clock signals to the set of flip-flops, wherein the first clock signal is complementary to the second clock signal.

13. The hybrid flop tray of claim 12, wherein the control circuit comprises:
   a NOR gate including a first input configured to receive the first clock signal, a second input configured to receive a reset signal, and an output coupled to a first clock port of each of the set of flip-flops; and
   an inverter including an input coupled to the output of the NOR gate, and an output coupled to a second clock port of each of the set of flip-flops.

14. The hybrid flop tray of claim 13, wherein at least one of the NOR gate or the inverter each includes a set of FinFETs each sized with the second number of fins.

15. The hybrid flop tray of claim 1, wherein each of the set of flip-flops includes a first shift port configured to receive the first shift signal, and wherein the control circuit comprises a first inverter including an input configured to receive the first shift signal, and an output coupled to a second shift port of each of the set of flip-flops.

16. The hybrid flop tray of claim 15, wherein the first inverter includes a set of FinFETs each sized with the second number of fins.

17. The hybrid flop tray of claim 1, wherein the control circuit comprises:
　　a second inverter including an input coupled to a scan output of one of the set of flip-flops; and
　　a NAND gate including a first input coupled to an output of the second inverter, a second input configured to receive the first shift signal, and an output configured to generate a scan out signal.

18. The hybrid flop tray of claim 17, wherein at least one of the second inverter or the NAND gate each includes a set of FinFETs each sized with the second number of fins.

19. A wireless communication device, comprising:

at least one antenna;

a transceiver coupled to the at least one antenna;

one or more signal processing cores coupled to the transceiver, wherein the one or more processing cores comprises a flop tray comprising:
　　a set of flip-flops cascaded along a scan path, wherein a first subset of one or more of the flip-flops of the set includes fin field effect transistors (FinFETs) each sized with a first number of fins, and a second subset of one or more of the flip-flops of the set includes FinFETs each sized a second number of fins, wherein the first number of fins is different than the second number of fins; and
　　a control circuit configured to provide control signals to the set of flip-flops, wherein the control circuit is configured to provide first and second shift signals to the set of flip-flops, wherein the first shift signal is complementary to the second shift signal.

* * * * *